(12) United States Patent
Majmundar et al.

(10) Patent No.: US 11,297,624 B2
(45) Date of Patent: *Apr. 5, 2022

(54) NETWORK CODING FOR BANDWIDTH EFFICIENT RELIABILITY IMPROVEMENT FOR URLLC SERVICE

(71) Applicant: AT&T INTELLECTUAL PROPERTY I, L.P., Atlanta, GA (US)

(72) Inventors: Milap Majmundar, Austin, TX (US); Arunabha Ghosh, Austin, TX (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 130 days.

This patent is subject to a terminal disclaimer.

(21) Appl. No.: 16/748,879

(22) Filed: Jan. 22, 2020

(65) Prior Publication Data

US 2020/0163077 A1 May 21, 2020

Related U.S. Application Data

(63) Continuation of application No. 15/983,044, filed on May 17, 2018, now Pat. No. 10,582,507.

(51) Int. Cl.
| | | |
|---|---|---|
| H04W 88/04 | (2009.01) | |
| H04W 72/04 | (2009.01) | |
| H04L 49/00 | (2022.01) | |
| H04L 69/22 | (2022.01) | |
| H04W 72/08 | (2009.01) | |

(52) U.S. Cl.
CPC ....... *H04W 72/048* (2013.01); *H04L 49/3072* (2013.01); *H04L 69/22* (2013.01); *H04W 72/085* (2013.01); *H04W 88/04* (2013.01)

(58) Field of Classification Search
CPC .................................................... H04L 12/50
USPC ........................................................ 370/400
See application file for complete search history.

(56) References Cited

U.S. PATENT DOCUMENTS

| | | |
|---|---|---|
| 9,350,683 B2 | 5/2016 | Hui et al. |
| 9,979,450 B2 | 5/2018 | Jang et al. |
| 2010/0100791 A1 | 4/2010 | Abu-Surra et al. |
| 2015/0358113 A1 | 12/2015 | Callard et al. |
| 2017/0332400 A1 | 11/2017 | Kowalski et al. |
| 2017/0359086 A1 | 12/2017 | Kudekar et al. |

(Continued)

FOREIGN PATENT DOCUMENTS

| | | |
|---|---|---|
| EP | 2 924 883 A1 | 9/2015 |
| WO | 2018/0009572 A1 | 1/2018 |

OTHER PUBLICATIONS

U.S. Appl. No. 15/983,044, filed May 17, 2018.

(Continued)

*Primary Examiner* — Dang T Ton
(74) *Attorney, Agent, or Firm* — Amin, Turocy & Watson, LLP

(57) ABSTRACT

A bandwidth efficient way to improve reliability without introducing additional latency is provided for Ultra-Reliable and Low Latency Communications (URLLC) service in 5G NR. In particular, using rateless fountain codes in conjunction with packet duplication for split bearers at the Packet Data Convergence Protocol (PDCP) layer increases the reliability of transmission without the need for retransmissions, and with a lower bandwidth requirement compared to traditional packet duplication.

20 Claims, 10 Drawing Sheets

(56) References Cited

U.S. PATENT DOCUMENTS

| | | | |
|---|---|---|---|
| 2018/0027576 A1 | 1/2018 | Kowalski et al. | |
| 2018/0027590 A1 | 1/2018 | Yerramalli et al. | |
| 2018/0042030 A1 | 2/2018 | Xu et al. | |
| 2018/0091485 A1 | 3/2018 | Lee et al. | |
| 2018/0098250 A1 | 4/2018 | Vrzic et al. | |
| 2018/0132237 A1 | 5/2018 | Sundararajan et al. | |
| 2018/0132263 A1 | 5/2018 | Nuggehalli et al. | |
| 2018/0145797 A1 | 5/2018 | Yeo et al. | |
| 2019/0357196 A1* | 11/2019 | Majmundar | H04L 69/22 |

OTHER PUBLICATIONS

Non-Final Office Action received for U.S. Appl. No. 15/983,044 dated Jun. 3, 2019, 29 pages.

FMTCP: A Fountain Code-based Multipath Transmission Control Protocol, Cui et al, 2012 pp. 366-375.

International Search Report and Written Opinion received for PCT Application Serial No. PCT/US2019/030706 dated Aug. 9, 2019, 19 pages.

Li et al., "RaptorQ Code based Concurrent Transmissions in Dual Connectivity LTE Network", 9th International Conference on Wireless Communications and Signal Processing, IEEE, Oct. 11, 2017, 6 pages.

Interdigital Communications, "Packet Duplication at PDCP", URL: http://www.3gpp.org/ftp/Meetings3GPPSVNC/RAN2/Docs, 3GPP TSG-RAN WG2 Meeting #97, R2-1701186, Feb. 13-17, 2017, 2 pages.

Vodafone, "User plane function selection for URLLC", URL:http://www.3gpp.org/ftp/tsg%5Fsa/WG2%5FArch/TSGS2%5F124%5FReno/Docs/, SA WG2 Meeting #124, S2-178596, Nov. 27-Dec. 1, 2017, 3 pages.

AT&T GNS Belgium SPRL, "URLLC Scenarios and Enhancements for NR Rel 16", URL: http://www.3gpp.org/ftp/tsg%5Fran/TSG%5FRAN/TSGR%5F80/Docs/RP%2D180792%2Ezip, 3GPP TSG RAN Meeting #80, RP-180792, Jun. 11-14, 2018, 5 pages.

\* cited by examiner

NETWORK CODING FOR BANDWIDTH EFFICIENT RELIABILITY IMPROVEMENT FOR URLLC SERVICE

RELATED APPLICATION

This The subject patent application is a continuation of, and claims priority to, U.S. Patent Application Ser. No. 15/983,044 (now U.S. Pat. No. 10,582,507), filed May 17, 2018, and entitled "NETWORK CODING FOR BANDWIDTH EFFICIENT REALIABLITY IMPROVEMENT URLLC SERVICE," the entirety of which application is hereby incorporated by reference herein.

TECHNICAL FIELD

The present application relates generally to the field of mobile communications and, more specifically, to using rateless codes for improving bandwidth efficiency and reliability in a next generation wireless network.

BACKGROUND

To meet the huge demand for data centric applications, Third Generation Partnership Project (3GPP) systems and systems that employ one or more aspects of the specifications of the Fourth Generation (4G) standard for wireless communications will be extended to a Fifth Generation (5G) standard for wireless communications. Unique challenges exist to provide levels of service associated with forthcoming 5G and other next generation network standards.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
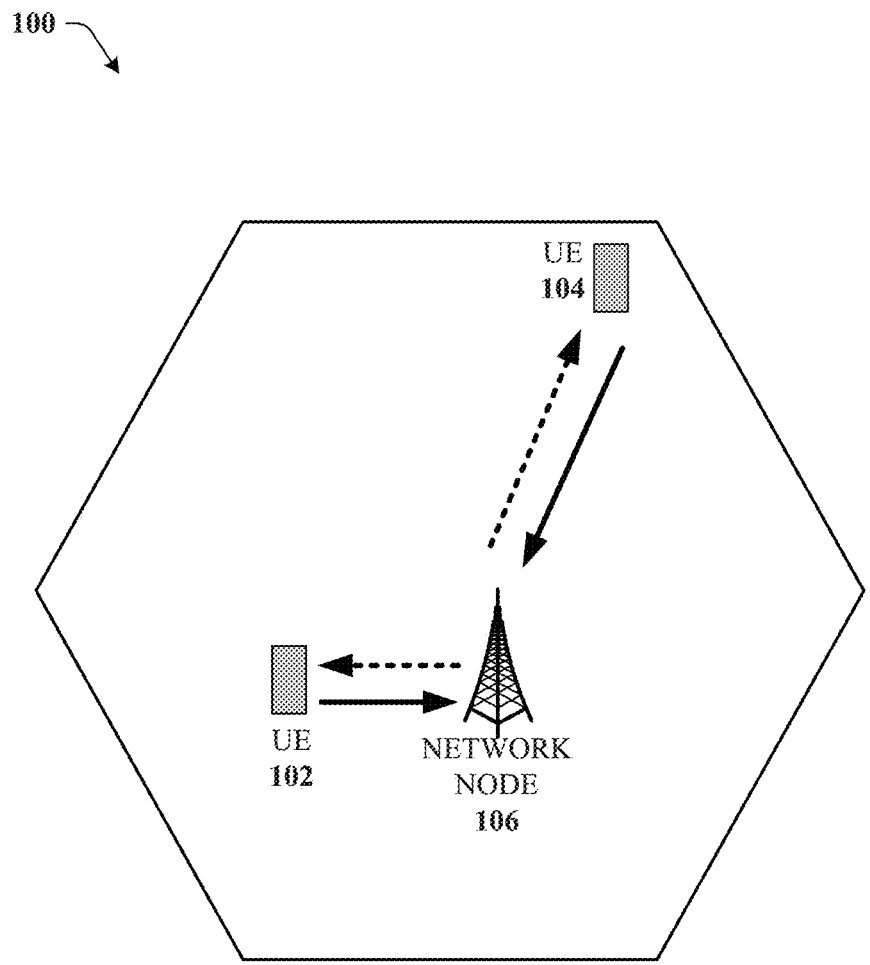
FIG. 1 illustrates an example wireless communication system in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

Various embodiments disclosed herein provide for a bandwidth efficient method and system for improving reliability without introducing additional latency for Ultra-Reliable and Low Latency Communications (URLLC) service in 5G NR. In particular, using rateless fountain codes in conjunction with packet duplication for split bearers at the Packet Data Convergence Protocol (PDCP) layer increases the reliability of transmission without the need for retransmissions, and with a lower bandwidth requirement compared to traditional packet duplication.

In various embodiments, a transceiver device can comprise a processor and a memory that stores executable instructions that, when executed by the processor facilitate performance of operations. The operations can comprise receiving a packet at a protocol stack of a radio access network. The operations can also comprise in response to determining that the packet is associated with a predefined radio access bearer, encoding the packet with a rateless fountain code, resulting in a group of encoded packets. The operations can also comprise transmitting the group of encoded packets to a receiver device via a group of relay devices.

In another embodiment, method comprises determining, by a radio access network device comprising a processor, that a packet is associated with a radio access bearer satisfying a defined criterion relating to latency and reliability of the radio access bearer, wherein the radio access network device is part of a radio access network. The method can also comprise encoding, by the radio access network device, the packet with a rateless fountain code resulting in a group of encoded packets. The method can also comprise transmitting, by the radio access network device, the group of encoded packets to a user equipment device via a split bearer associated with a group of network paths of the radio access network.

In another embodiment, a receiver device can comprise a processor and a memory that stores executable instructions that, when executed by the processor facilitate performance of operations. The operations can comprise receiving encoded packets associated with a split bearer, wherein the encoded packets are received from respective relay devices. The operations can also comprise verifying an integrity of the encoded packets. The operations can also comprise determining that the encoded packets are associated with a radio access bearer satisfying a defined criterion relating to latency and reliability. The operations can also comprise decoding the encoded packets using a rateless fountain code, resulting in a decoded packet.

As used in this disclosure, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component.

One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software application or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable (or machine-readable) device or computer-readable (or machine-readable) storage/communications media. For example, computer readable storage media can comprise, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

Moreover, terms such as "mobile device equipment," "mobile station," "mobile," subscriber station," "access terminal," "terminal," "handset," "communication device," "mobile device" (and/or terms representing similar terminology) can refer to a wireless device utilized by a subscriber or mobile device of a wireless communication service to receive or convey data, control, voice, video, sound, gaming or substantially any data-stream or signaling-stream. The foregoing terms are utilized interchangeably herein and with reference to the related drawings. Likewise, the terms "access point (AP)," "Base Station (BS)," BS transceiver, BS device, cell site, cell site device, "gNode B (gNB)," "evolved Node B (eNode B)," "home Node B (HNB)" and the like, are utilized interchangeably in the application, and refer to a wireless network component or appliance that transmits and/or receives data, control, voice, video, sound, gaming or substantially any data-stream or signaling-stream from one or more subscriber stations. Data and signaling streams can be packetized or frame-based flows.

Furthermore, the terms "device," "communication device," "mobile device," "subscriber," "customer entity," "consumer," "customer entity," "entity" and the like are employed interchangeably throughout, unless context warrants particular distinctions among the terms. It should be appreciated that such terms can refer to human entities or automated components supported through artificial intelligence (e.g., a capacity to make inference based on complex mathematical formalisms), which can provide simulated vision, sound recognition and so forth.

Embodiments described herein can be exploited in substantially any wireless communication technology, comprising, but not limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Z-Wave, Zigbee and other 802.XX wireless technologies and/or legacy telecommunication technologies.

FIG. 1 illustrates an example wireless communication system 100 in accordance with various aspects and embodiments of the subject disclosure. In one or more embodiments, system 100 can comprise one or more user equipment UEs 104 and 102, which can have one or more antenna panels having vertical and horizontal elements. A UE 102 can be a mobile device such as a cellular phone, a smartphone, a tablet computer, a wearable device, a virtual reality (VR) device, a heads-up display (HUD) device, a smart car, a machine-type communication (MTC) device, and the like. UE 102 can also refer to any type of wireless device that communicates with a radio network node in a cellular or mobile communication system. Examples of UE 102 are target device, device to device (D2D) UE, machine type UE or UE capable of machine to machine (M2M) communication, PDA, Tablet, mobile terminals, smart phone, laptop embedded equipped (LEE), laptop mounted equipment (LME), USB dongles etc. User equipment UE 102 can also comprise IOT devices that communicate wirelessly. In various embodiments, system 100 is or comprises a wireless communication network serviced by one or more wireless communication network providers. In example embodiments, a UE 102 can be communicatively coupled to the wireless communication network via a network node 106.

The non-limiting term network node (or radio network node) is used herein to refer to any type of network node serving a UE 102 and UE 104 and/or connected to other network node, network element, or another network node from which the UE 102 or 104 can receive a radio signal. Network nodes can also have multiple antennas for performing various transmission operations (e.g., MIMO operations). A network node can have a cabinet and other protected enclosures, an antenna mast, and actual antennas. Network nodes can serve several cells, also called sectors, depending on the configuration and type of antenna. Examples of network nodes (e.g., network node 106) can comprise but are not limited to: NodeB devices, base station (BS) devices, access point (AP) devices, and radio access network (RAN) devices. The network node 106 can also comprise multi-standard radio (MSR) radio node devices, including but not limited to: an MSR BS, an eNode B, a network controller, a radio network controller (RNC), a base station controller (BSC), a relay, a donor node controlling relay, a base transceiver station (BTS), a transmission point, a transmission node, an RRU, an RRH, nodes in distributed antenna system (DAS), and the like. In 5G terminology, the node 106 can be referred to as a gNodeB device.

Wireless communication system 100 can employ various cellular technologies and modulation schemes to facilitate wireless radio communications between devices (e.g., the UE 102 and 104 and the network node 106). For example, system 100 can operate in accordance with a UMTS, long term evolution (LTE), high speed packet access (HSPA), code division multiple access (CDMA), time division multiple access (TDMA), frequency division multiple access (FDMA), multi-carrier code division multiple access (MC-CDMA), single-carrier code division multiple access (SC-CDMA), single-carrier FDMA (SC-FDMA), OFDM, (DFT)-spread OFDM or SC-FDMA)), FBMC, ZT DFT-s-OFDM, GFDM, UFMC, UW DFT-Spread-OFDM, UW-OFDM, CP-OFDM, resource-block-filtered OFDM, and UFMC. However, various features and functionalities of system 100 are particularly described wherein the devices (e.g., the UEs 102 and 104 and the network device 106) of system 100 are configured to communicate wireless signals using one or more multi carrier modulation schemes, wherein data symbols can be transmitted simultaneously over multiple frequency subcarriers (e.g., OFDM, CP-OFDM, DFT-spread OFMD, UFMC, FMBC, etc.).

In various embodiments, system 100 can be configured to provide and employ 5G wireless networking features and functionalities. 5G wireless communication networks are expected to fulfill the demand of exponentially increasing data traffic and to allow people and machines to enjoy gigabit data rates with virtually zero latency. Compared to 4G, 5G supports more diverse traffic scenarios. For example, in addition to the various types of data communication between conventional UEs (e.g., phones, smartphones, tablets, PCs, televisions, Internet enabled televisions, etc.) supported by 4G networks, 5G networks can be employed to support data communication between smart cars in association with driverless car environments, as well as machine type communications (MTCs).

Figure 2:
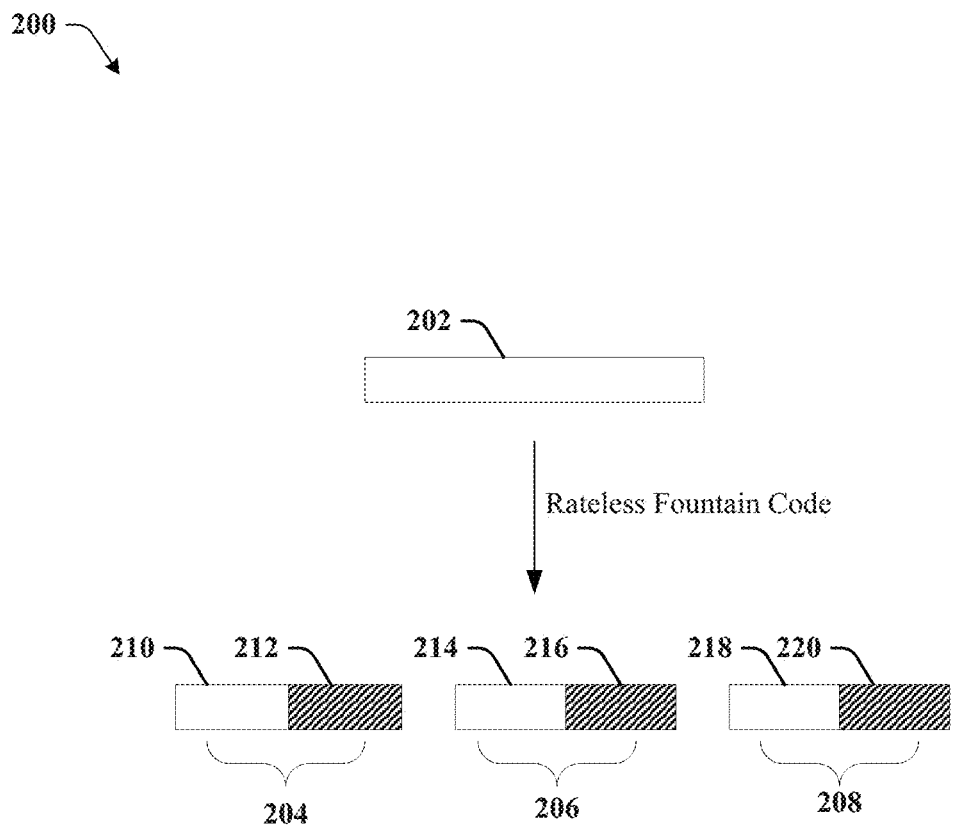
FIG. 2 illustrates an example block diagram showing a rateless fountain code encoding a packet in accordance with various aspects and embodiments of the subject disclosure.

Turning now to FIG. 2, illustrated is an example block diagram 200 showing a rateless fountain code encoding a packet in accordance with various aspects and embodiments of the subject disclosure.

A rateless fountain code can be a class of erasure codes with the property that a potentially limitless sequence of encoding symbols can be generated from a given set of source symbols such that the original source symbols can ideally be recovered from any subset of the encoding symbols of size equal to or only slightly larger than the number of source symbols. The term fountain or rateless refers to the fact that these codes do not exhibit a fixed code rate. In an embodiment, rateless fountain codes can generate any number of encoded symbols from a given block of k source symbols (hence, rateless). Then it is possible to decode the encoded symbols using any n transmitted symbols, where n>k (overhead rate=(n−k)/k).

In the embodiment shown in FIG. 2, a packet 202 can be encoded with a rateless fountain code resulting in three encoded packets, 204, 206, and 208. Each of the encoded packets 204, 206, and 208 can comprise a set of source bits (e.g., 210, 214, and 218) and a set of repair bits 212, 216, and 220. The source bits comprise the information from the packet 202, and the repair bits can be used to reconstruct the packet 202 at a receiver in case any of the encoded packets 204, 206, and 208 are corrupted or otherwise missing at the receiver.

As an example, source packet 202 can be 240 bits long and can be transmitted to a UE that has a 3 way multi-connectivity split bearer established with the NR network. Based on these 240 source bits, a rateless fountain code is used to generate 240 repair bits. The 240 repair bits are combined with 240 source bits to create, for example, 3 PDCP packets (e.g., encoded packets 204, 206, and 208) of size 160 bits each, where each PDCP packet contains 80 source bits and 80 repair bits (e.g., encoded packet 204 comprises 80 source bits in section 210, and 80 repair bits in section 212). So, a total of 480 bits are transmitted for the 240 bit URLLC packet. Based on the properties of the rateless fountain code, the decoder at the UE PDCP layer can reconstruct the packet 202 as long as any 320 bits are received successfully. This means the UE needs to successfully receive only 2 out of 3 transmitted packets in order to decode the URLLC packet successfully.

In the above example, since 480 bits are transmitted for a 240 bit URLLC packet, the overhead to achieve this additional reliability enhancement for URLLC is (480−240)/240=100%. If we compare this to a traditional packet duplication solution where the same URLLC packet is duplicated and transmitted over the 3 multi-connectivity legs, the total number of transmitted bits are 240×3=720 bits. So, the overhead for the traditional packet duplication case is (720−240)/240=200%. This means that the proposed solution described in this paper has the potential to provide the same level of reliability enhancement as a packet duplication solution with about half the bandwidth overhead.

It is to be appreciated that in other embodiments, the size of the packet 202 can be different, and the size and number of encoded packets can also be different. In at least one embodiment, the number of encoded packets (e.g., packets 204, 206, and 208) that are generated due to the rateless fountain code can be based on the number of network paths of the split bearer, or the number of relay devices that the transmitter transmits the encoded packets through to get to the receiver. In an embodiment, the rateless fountain code can be a Raptor code. In another embodiment, the modified PDCP technique of using the rateless fountain code can be performed on any packet on a bearer that satisfies a predetermined criterion relating to latency and reliability. As an example, there may be bearers other than URLLC type bearers that require high reliability and/or low latency. These techniques disclosed herein can also be applied to such bearers.

Figure 3:
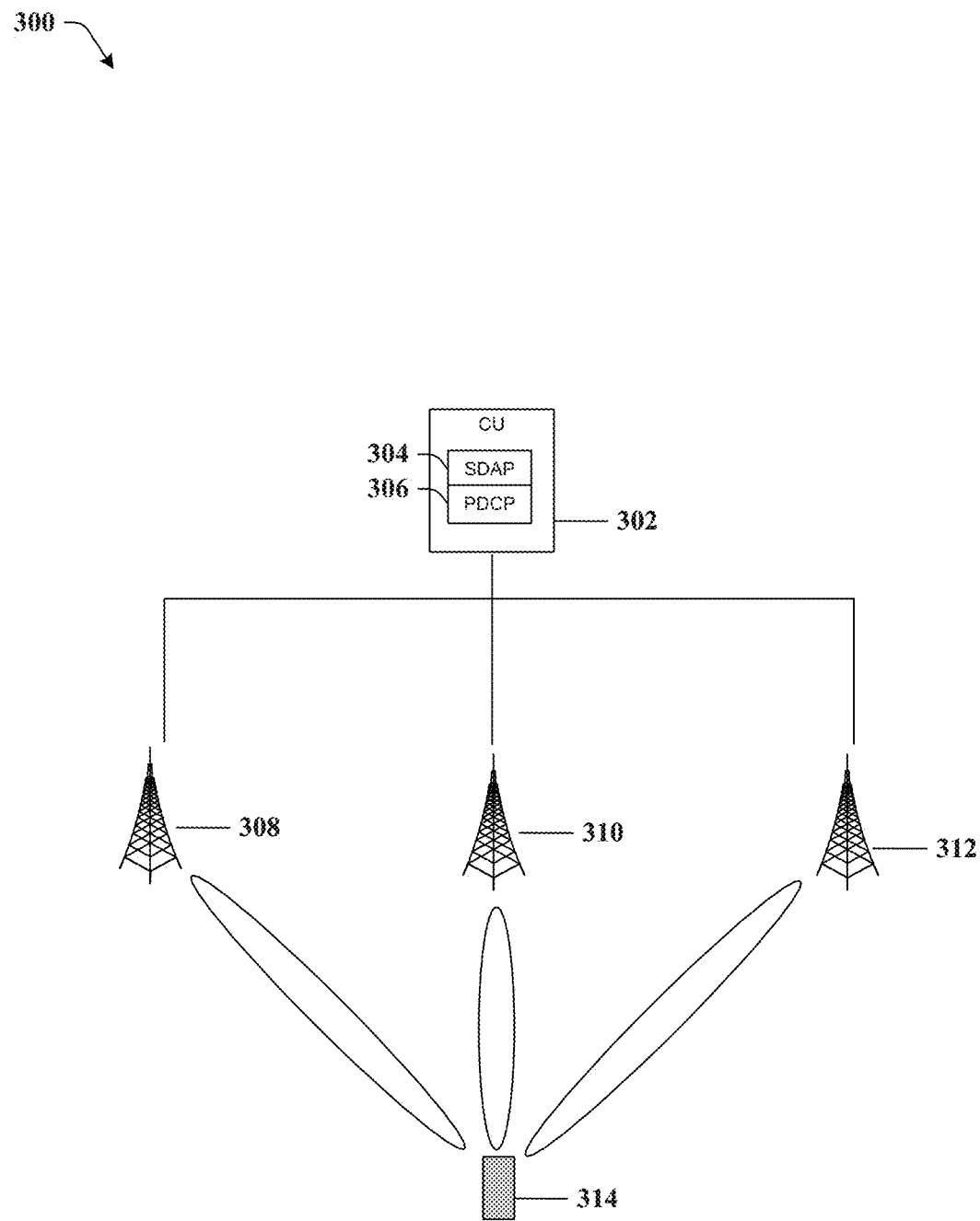
FIG. 3 illustrates an example block diagram showing a multi-connectivity split bearer in accordance with various aspects and embodiments of the subject disclosure.

Turning now to FIG. 3, illustrated is an example block diagram 300 showing a multi-connectivity split bearer in a radio access network in accordance with various aspects and embodiments of the subject disclosure.

In the embodiment, the radio access network can be a traditional radio access network, or can be a Cloud Radio Access Network where some of the processing layers of the radio access network are performed in the cloud, allowing for smaller and more distributed transmitters (e.g., 308, 310, and 312). In other embodiments, the radio access network can have a functional split, where some of the functions are performed at Central Unit (CU) 302, and other functions performed at a Distributed Unit (DU) (e.g., 308, 310, and 312). In this architecture, CU and DU can be defined as follows.

A CU can be a logical node that includes the gNB functions like Transfer of user data, Mobility control, Radio access network sharing, Positioning, Session Management etc., except those functions allocated exclusively to the DU. CU controls the operation of DUs over front-haul (Fs) interface. A central unit (CU) may also be known as BBU/REC/RCC/C-RAN/V-RAN.

A DU can be a logical node that includes a subset of the gNB functions, depending on the functional split option. Its operation is controlled by the CU. Distributed Unit (DU) also known with other names like RRH/RRU/RE/RU. In an embodiment, DUs 308, 310, and 312 can be connected via a wireline communication or via a wireless communication with the CU 302. Also, in an embodiment, DUs 308, 310, and 312 can have some layers of the RAN protocol stack (e.g., Physical Interface, Media Access Controller and Radio Link Control) while the Packet Data Convergence Protocol (PDCP) layer 306 and the Service Data Adaptation Protocol (SDAP) layer 304 and other layers can be a part of the CU 302.

In an embodiment, the rateless fountain code can be applied to the packets at the PDCP layer 306 or above the PDCP layer 306 (e.g., at the SDAP 304). After the rateless fountain code is applied to a packet a group of encoded packets can be formed with each containing a portion of the information bits of the original packet. Each respective encoded packet can be transmitted to the UE 314 via respective relay devices (DUs 308, 310, or 312) at the same time. The UE 314 can receive the encoded packets and use a rateless fountain decoder to decode the encoded packets to reconstruct the original packet. Even if one of the transmissions from DUs 308, 310 or 312 are corrupted, as long as enough packets are received that are at least the same size as the original packet, the original packet can be reconstructed.

It is to be appreciated that in other embodiments, there can be more or fewer DU devices. The number of the DU devices can depend the multi-connectivity capacity of the UE 314 or the RAN, as well as the number of DU devices within range of the UE 314. In an embodiment, the number encoded packets generated by the rateless fountain code can be based on the number of paths, or DUs available for the split bearer transmission.

In an embodiment, the advantages provided by this technique of rateless fountain codes and multiconnectivity can significantly increase the reliability of URLLC services compared to earlier releases. The disclosed technique can also provide such increase in reliability with much less increase in bandwidth need compared to other state-of-the-art solutions such as packet duplication. Furthermore, this technique is based on enhancements made to the NR air interface protocol stack, and specifically at the PDCP layer rather than at the application layer for prior state-of-the-art solutions. Hence, this solution is closer to the RAN air interface, which makes it more suitable for a tight latency sensitive service such as URLLC.

Figure 4:
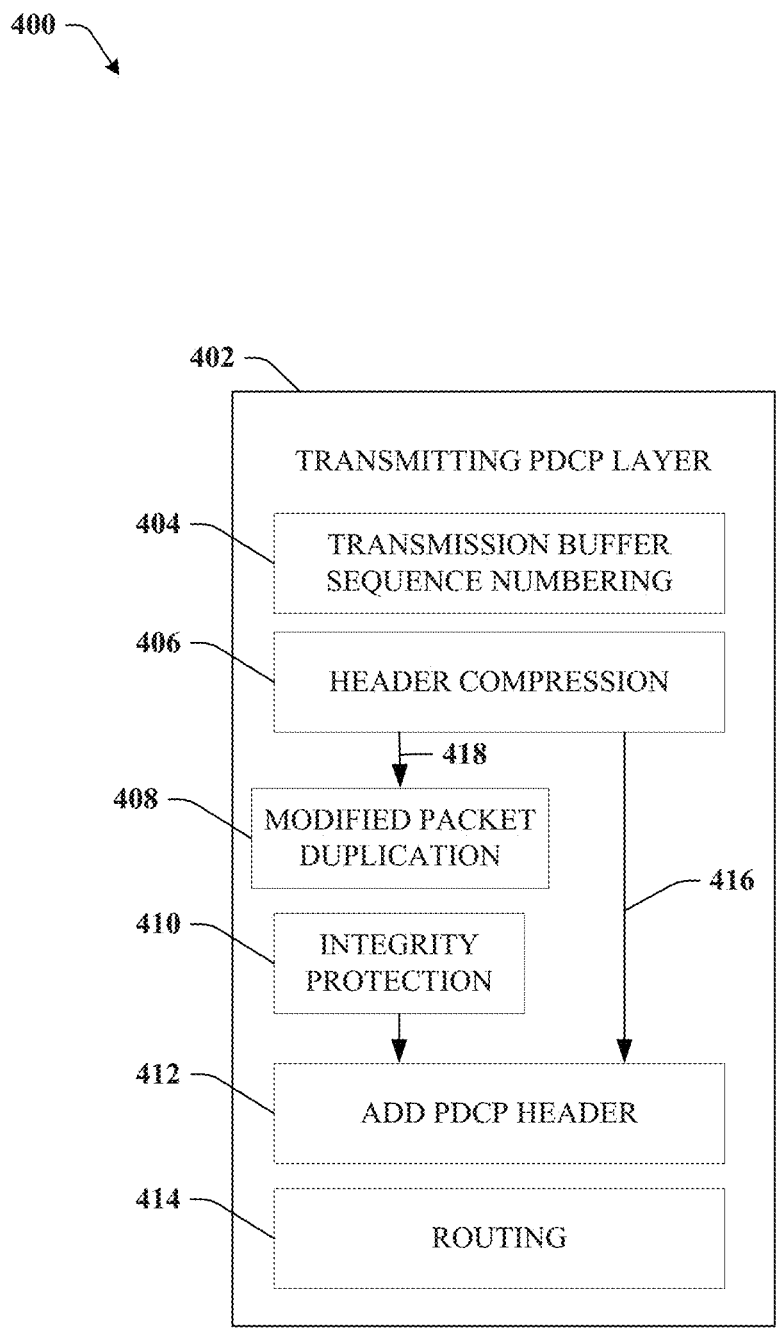
FIG. 4 illustrates an example block diagram of a transmitter's packet data convergence protocol layer in accordance with various aspects and embodiments of the subject disclosure.

Turning now to FIG. 4, illustrated is an example block diagram 400 of a transmitter's packet data convergence protocol layer 402 in accordance with various aspects and embodiments of the subject disclosure. The transmitter's PDCP layer 402 can be part of a radio access network (e.g., for a downlink communication) or part of a UE's protocol stack (e.g., for an uplink communication).

In an embodiment, the PDCP layer 402 depicted here can be part of a CU or gNB, or C-RAN environment where the PDCP functions are performed.

In an embodiment, when a URLLC bearer is established, an N-way split bearer connection with modified packet duplication (using the rateless fountain code technique described herein) is set up between the RAN and the UE using multiconnectivity. A URLLC packet arrives at the transmission buffer sequence numbering function 404 as a PDCP service data unit (SDU). The PDCP layer 402 processes the PDCP SDU as normal up to the header compression function 406 where the PDCP layer 402 recognizes the URLLC SDU packet as belonging to a split bearer so forwards the packet 418 to the modified packet duplication function 408 which is executed before the integrity protection 410, ciphering and PDCP header addition function 412. The modified packet duplication function 408 executes the encoder processing for a pre-configured rateless fountain code to generate N PDCP Protocol Data Units (PDUs) that are generated for transmission corresponding to the N-way split bearer connection. Integrity protection and ciphering processing can be executed for the N PDCP PDUs at the Integrity Protection function 410, and then PDCP header function 412 can add identical PDCP headers to each of the N PDCP PDUs since this is a split bearer with packet duplication. The N PDCP PDUs are transmitted via N network routes to the UE by the routing function 414.

The PDCP layer 402 can recognize the packets that are associated with the URLLC bearer (e.g., 418) and forward those to the modified packet duplication function 408 while other packets (e.g., 416) are forwarded to the PDCP header function 412.

Figure 5:
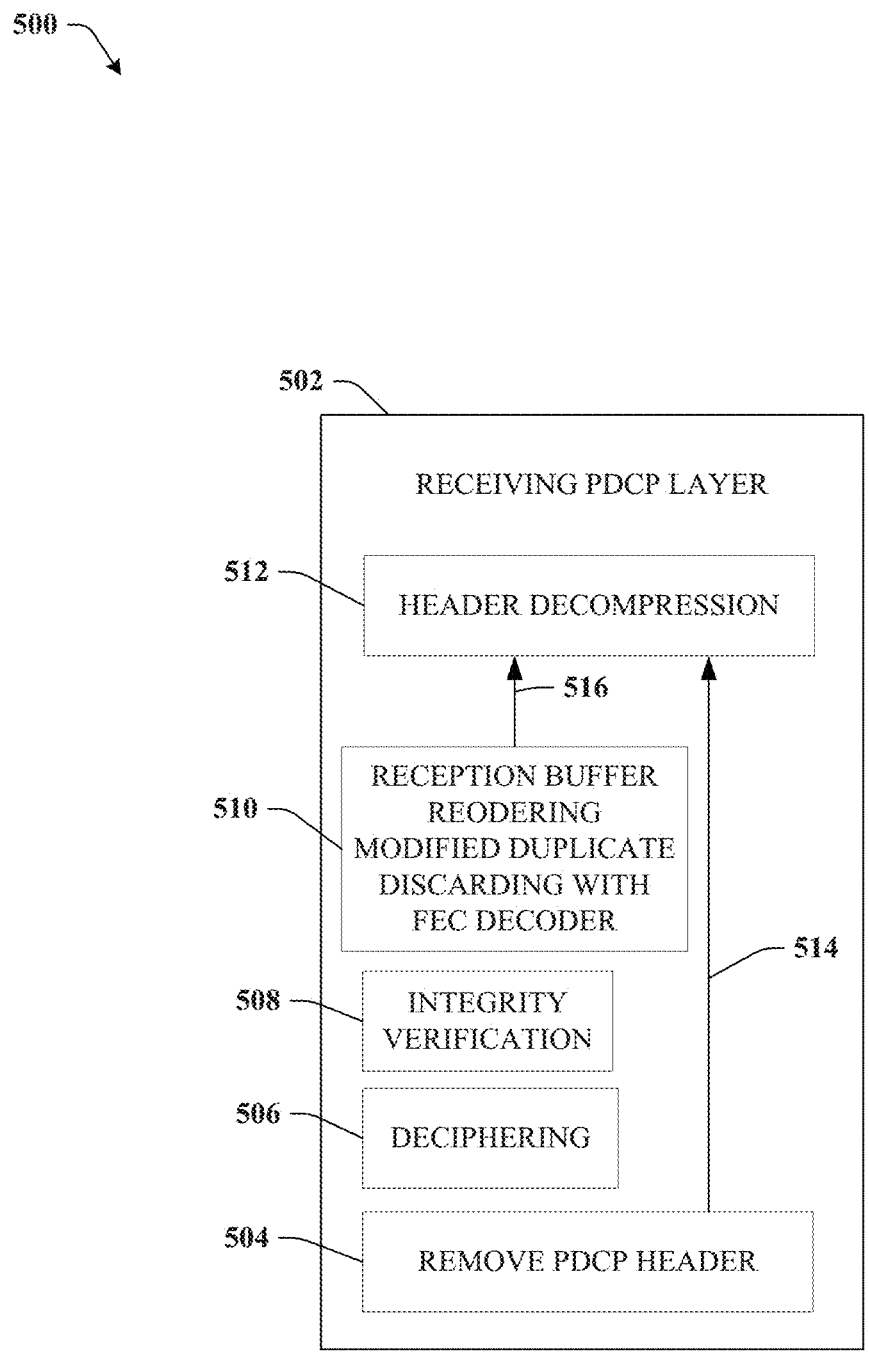
FIG. 5 illustrates an example block diagram of a receiver's packet data convergence protocol layer in accordance with various aspects and embodiments of the subject disclosure.

Turning now to FIG. 5, illustrated is an example block diagram 500 of a receiver's packet data convergence protocol layer 502 in accordance with various aspects and embodiments of the subject disclosure.

At the receiving PDCP layer (e.g., for a downlink communication to a UE, or for an uplink transmission to a network). The encoded packets can be received at the PDCP Header removal function 504 where the headers are removed, and then deciphering layer 506 and integrity verification layer 508 can decipher and verify the packets.

After successfully passing deciphering and integrity verification, at the reception buffer stage 510, the function that performs duplicate discarding recognizes that this is a URLLC bearer, so rather than executing the normal duplicate discarding function, it gathers all the received 'duplicate' packets received from lower RLC layers, it executes the decoder for the pre-configured rateless fountain code. This modified duplicate discarding function needs to successfully receive only N-M of the transmitted PDCP packets to be able to successfully decode the PDCP PDU corresponding to the URLLC packet. As long as there are at least as many bits in the successfully verified packets as there are in the original packet, the preconfigured rateless fountain code will be successful in decoding the encoded packets. Then the reception buffer reordering function can pass the PDCP PDU 516 to the header decompression function 512.

After successful decoding of the received PDCP PDU, it is stored in the PDCP reception buffer according to its sequence number (this is normal PDCP processing). The PDCP header removal function 504 can pass the non URLLC related packets 514 to the header decompression function 512.

Figure 6:
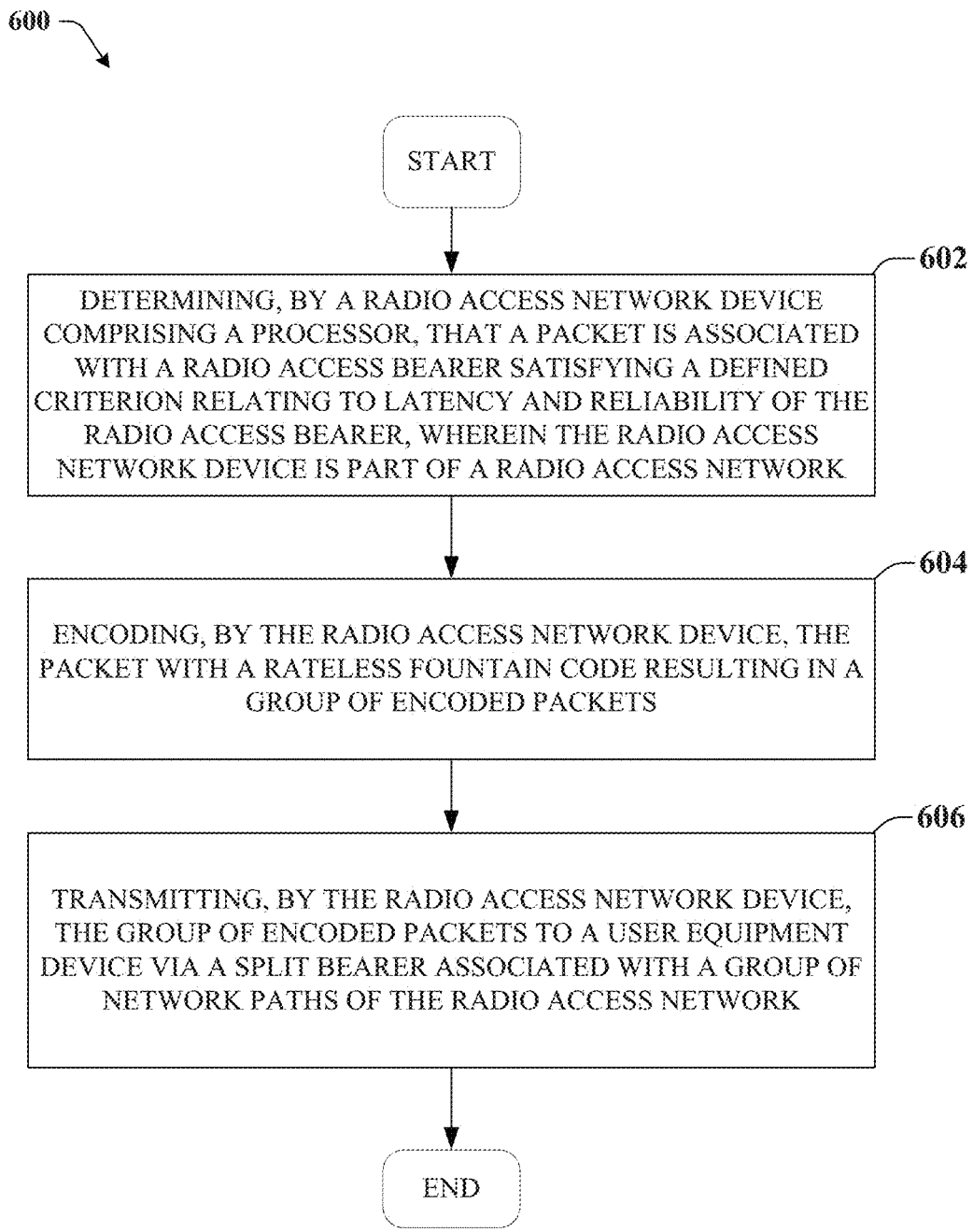
FIG. 6 illustrates an example method for using rateless fountain codes to transmit a packet in accordance with various aspects and embodiments of the subject disclosure.
Figure 7:
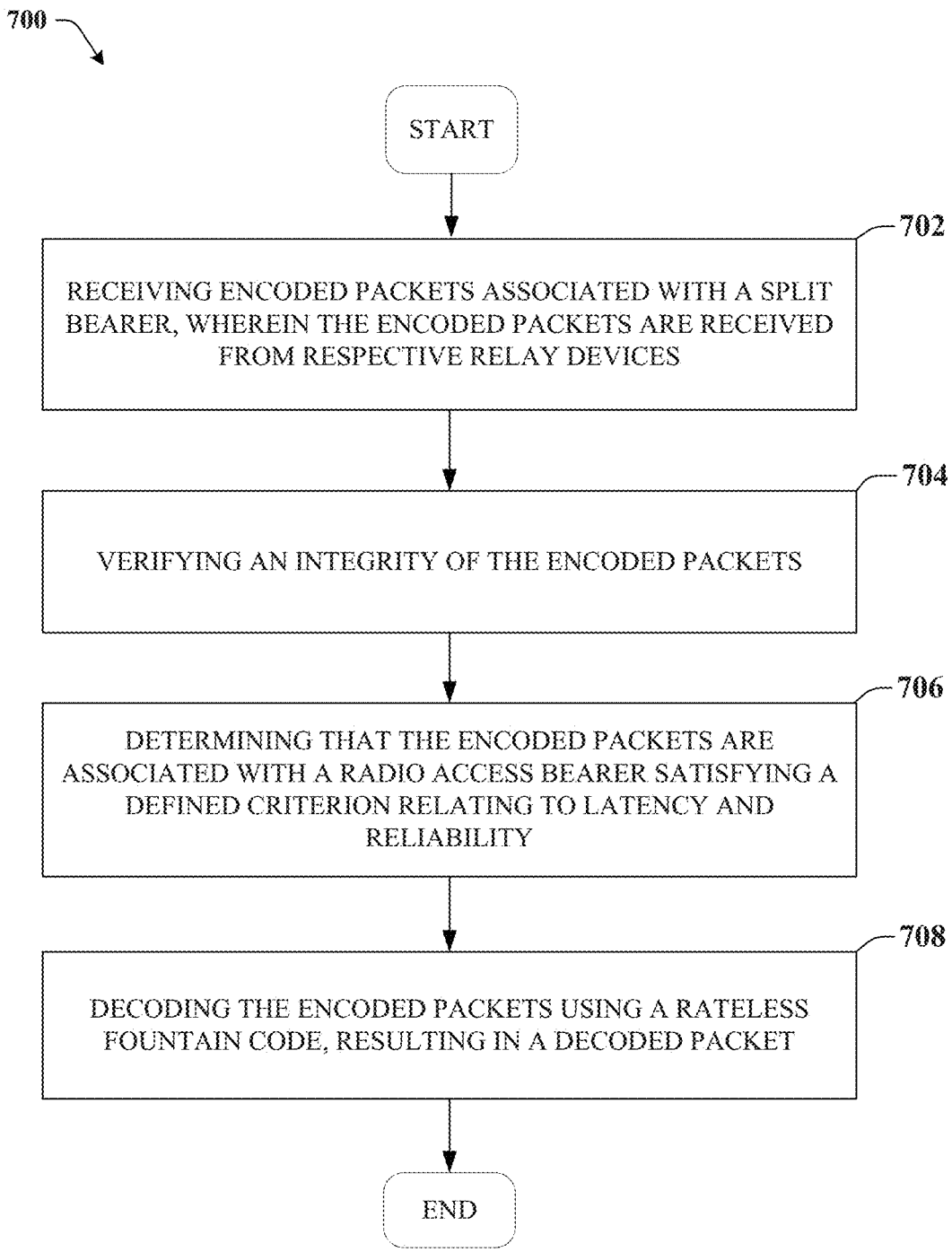
FIG. 7 illustrates an example method for using rateless fountain codes to receive a packet in accordance with various aspects and embodiments of the subject disclosure.

FIGS. 6-7 illustrates a process in connection with the aforementioned systems. The processes in FIGS. 6-7 can be implemented for example by the systems in FIGS. 1-5 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 6 illustrates example method 600 for using rateless fountain codes to transmit a packet in accordance with various aspects and embodiments of the subject disclosure.

Method 600 can begin at 602 where the method includes determining, by a radio access network device comprising a processor, that a packet is associated with a radio access bearer satisfying a defined criterion relating to latency and reliability of the radio access bearer, wherein the radio access network device is part of a radio access network.

At 604, the method includes encoding, by the radio access network device, the packet with a rateless fountain code resulting in a group of encoded packets.

At 606, the method includes transmitting, by the radio access network device, the group of encoded packets to a user equipment device via a split bearer associated with a group of network paths of the radio access network.

FIG. 7 illustrates example method 700 for using rateless fountain codes to receive a packet in accordance with various aspects and embodiments of the subject disclosure.

Method 700 can begin at 702 wherein the method includes receiving encoded packets associated with a split bearer, wherein the encoded packets are received from respective relay devices.

At 704, the method can include verifying an integrity of the encoded packets.

At 706, the method can include determining that the encoded packets are associated with a radio access bearer satisfying a defined criterion relating to latency and reliability.

Figure 8:
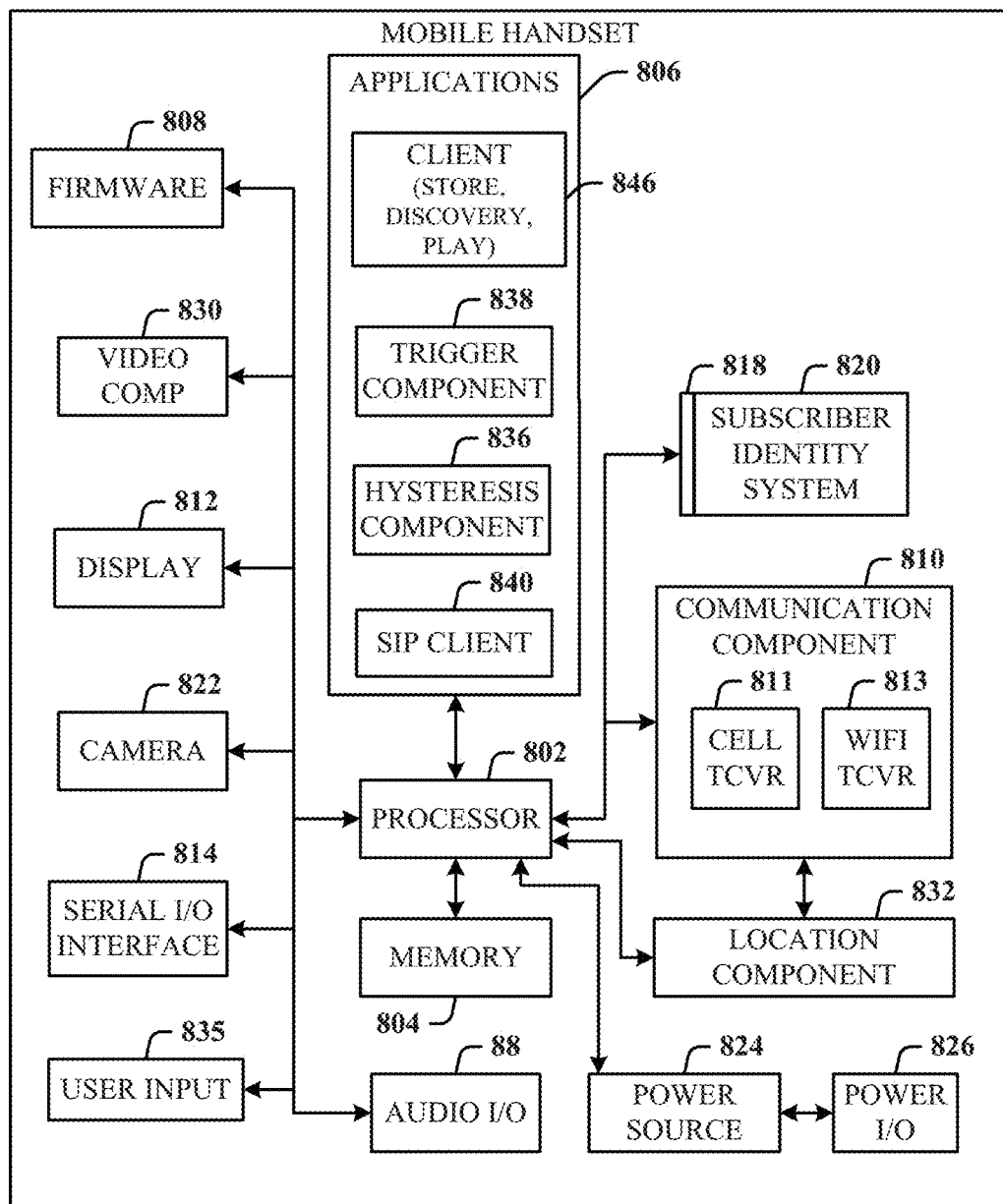
FIG. 8 illustrates an example block diagram of an example user equipment that can be a mobile handset in accordance with various aspects and embodiments of the subject disclosure.

At 708, the method can include decoding the encoded packets using a rateless fountain code, resulting in a decoded packet Referring now to FIG. 8, illustrated is a schematic block diagram of an example end-user device such as a user equipment) that can be a mobile device 800 capable of connecting to a network in accordance with some embodiments described herein. Although a mobile handset 800 is illustrated herein, it will be understood that other devices can be a mobile device, and that the mobile handset 800 is merely illustrated to provide context for the embodiments of the various embodiments described herein. The following discussion is intended to provide a brief, general description of an example of a suitable environment 800 in which the various embodiments can be implemented. While the description includes a general context of computer-executable instructions embodied on a machine-readable storage medium, those skilled in the art will recognize that the various embodiments also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above may also be included within the scope of computer-readable media.

The handset 800 includes a processor 802 for controlling and processing all onboard operations and functions. A memory 804 interfaces to the processor 802 for storage of data and one or more applications 806 (e.g., a video player software, user feedback component software, etc.). Other applications can include voice recognition of predetermined voice commands that facilitate initiation of the user feedback signals. The applications 806 can be stored in the memory 804 and/or in a firmware 808, and executed by the processor 802 from either or both the memory 804 or/and the firmware 808. The firmware 808 can also store startup code for execution in initializing the handset 800. A communications component 810 interfaces to the processor 802 to facilitate wired/wireless communication with external systems, e.g., cellular networks, VoIP networks, and so on. Here, the communications component 810 can also include a suitable cellular transceiver 811 (e.g., a GSM transceiver) and/or an unlicensed transceiver 813 (e.g., Wi-Fi, WiMax) for corresponding signal communications. The handset 800 can be a device such as a cellular telephone, a PDA with mobile communications capabilities, and messaging-centric devices. The communications component 810 also facilitates communications reception from terrestrial radio networks (e.g., broadcast), digital satellite radio networks, and Internet-based radio services networks.

The handset 800 includes a display 812 for displaying text, images, video, telephony functions (e.g., a Caller ID function), setup functions, and for user input. For example, the display 812 can also be referred to as a "screen" that can accommodate the presentation of multimedia content (e.g., music metadata, messages, wallpaper, graphics, etc.). The display 812 can also display videos and can facilitate the generation, editing and sharing of video quotes. A serial I/O interface 814 is provided in communication with the processor 802 to facilitate wired and/or wireless serial communications (e.g., USB, and/or IEEE 1394) through a hardwire connection, and other serial input devices (e.g., a keyboard, keypad, and mouse). This supports updating and troubleshooting the handset 800, for example. Audio capabilities are provided with an audio I/O component 816, which can include a speaker for the output of audio signals related to, for example, indication that the user pressed the proper key or key combination to initiate the user feedback signal. The audio I/O component 816 also facilitates the input of audio signals through a microphone to record data and/or telephony voice data, and for inputting voice signals for telephone conversations.

The handset 800 can include a slot interface 818 for accommodating a SIC (Subscriber Identity Component) in the form factor of a card Subscriber Identity Module (SIM) or universal SIM 820, and interfacing the SIM card 820 with the processor 802. However, it is to be appreciated that the SIM card 820 can be manufactured into the handset 800, and updated by downloading data and software.

The handset 800 can process IP data traffic through the communication component 810 to accommodate IP traffic from an IP network such as, for example, the Internet, a corporate intranet, a home network, a person area network, etc., through an ISP or broadband cable provider. Thus, VoIP traffic can be utilized by the handset 800 and IP-based multimedia content can be received in either an encoded or decoded format.

A video processing component 822 (e.g., a camera) can be provided for decoding encoded multimedia content. The video processing component 822 can aid in facilitating the generation, editing and sharing of video quotes. The handset 800 also includes a power source 824 in the form of batteries and/or an AC power subsystem, which power source 824 can interface to an external power system or charging equipment (not shown) by a power I/O component 826.

The handset 800 can also include a video component 830 for processing video content received and, for recording and transmitting video content. For example, the video component 830 can facilitate the generation, editing and sharing of video quotes. A location tracking component 832 facilitates geographically locating the handset 800. As described hereinabove, this can occur when the user initiates the feedback signal automatically or manually. A user input component 834 facilitates the user initiating the quality feedback signal. The user input component 834 can also facilitate the generation, editing and sharing of video quotes. The user input component 834 can include such conventional input device technologies such as a keypad, keyboard, mouse, stylus pen, and/or touch screen, for example.

Referring again to the applications 806, a hysteresis component 836 facilitates the analysis and processing of hysteresis data, which is utilized to determine when to associate with the access point. A software trigger component 838 can be provided that facilitates triggering of the hysteresis component 838 when the Wi-Fi transceiver 813 detects the beacon of the access point. A SIP client 840 enables the handset 800 to support SIP protocols and register the subscriber with the SIP registrar server. The applications 806 can also include a client 842 that provides at least the capability of discovery, play and store of multimedia content, for example, music.

The handset 800 can include an indoor network radio transceiver 813 (e.g., Wi-Fi transceiver). This function supports the indoor radio link, such as IEEE 802.11, for the dual-mode GSM handset 1500. The handset 800 can accommodate at least satellite radio services through a handset that can combine wireless voice and digital radio chipsets into a single handheld device.

Figure 9:
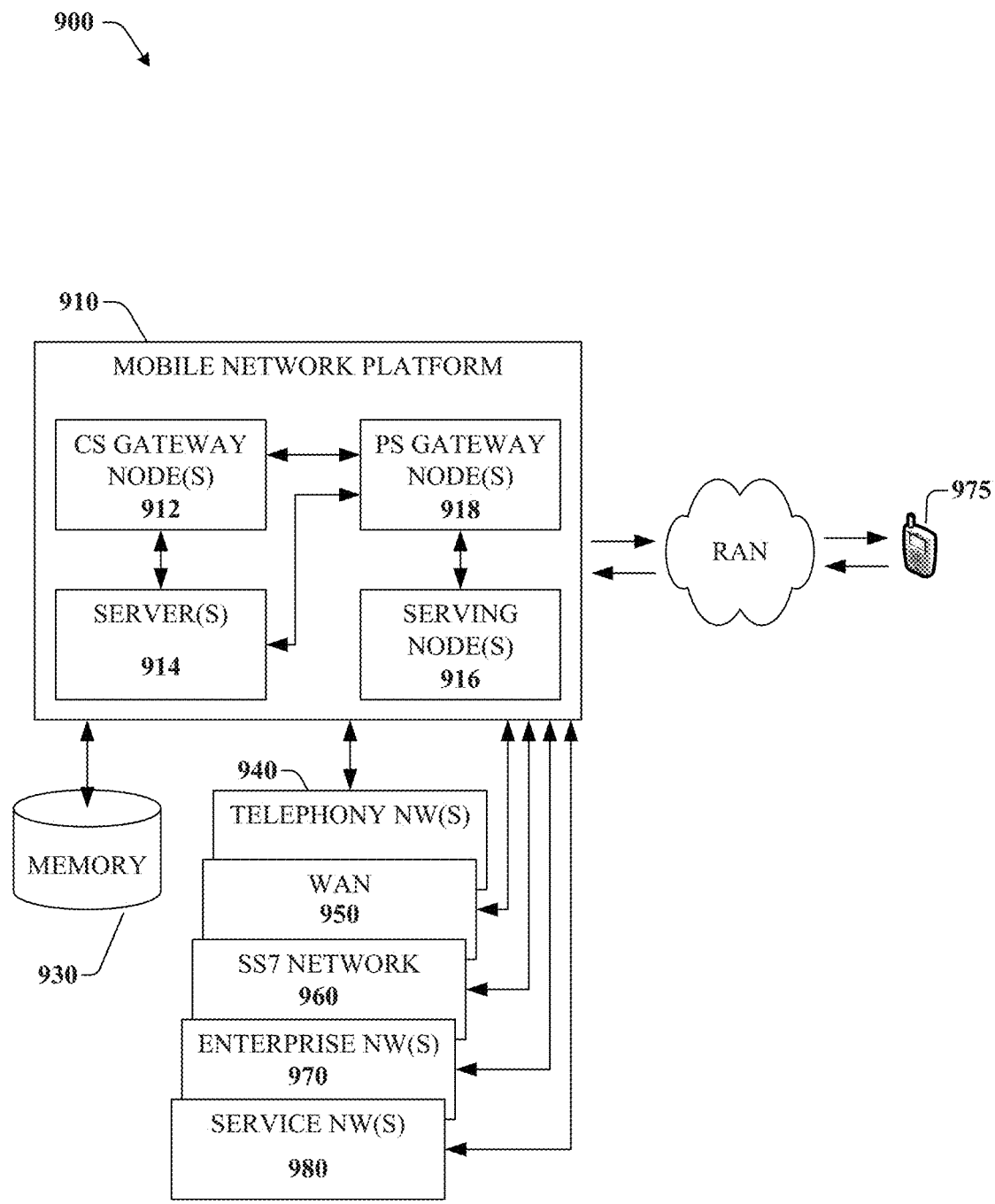
FIG. 9 illustrates an example block diagram of a non-limiting embodiment of a mobile network platform in accordance with various aspects described herein.

FIG. 9 presents an example embodiment 900 of a mobile network platform 910 that can implement and exploit one or more aspects of the disclosed subject matter described herein. Generally, wireless network platform 910 can include components, e.g., nodes, gateways, interfaces, servers, or disparate platforms, that facilitate both packet-switched (PS) (e.g., internet protocol (IP), frame relay, asynchronous transfer mode (ATM) and circuit-switched (CS) traffic (e.g., voice and data), as well as control generation for networked wireless telecommunication. As a non-limiting example, wireless network platform 910 can be included in telecommunications carrier networks, and can be considered carrier-side components as discussed elsewhere herein. Mobile network platform 910 includes CS gateway node(s) 912 which can interface CS traffic received from legacy networks like telephony network(s) 940 (e.g., public switched telephone network (PSTN), or public land mobile network (PLMN)) or a signaling system #7 (SS7) network 960. Circuit switched gateway node(s) 912 can authorize and authenticate traffic (e.g., voice) arising from such networks. Additionally, CS gateway node(s) 912 can access mobility, or roaming, data generated through SS7 network 960; for instance, mobility data stored in a visited location register (VLR), which can reside in memory 930. Moreover, CS gateway node(s) 912 interfaces CS-based traffic and signaling and PS gateway node(s) 918. As an example, in a 3GPP UMTS network, CS gateway node(s) 912 can be realized at least in part in gateway GPRS support node(s) (GGSN). It should be appreciated that functionality and specific operation of CS gateway node(s) 912, PS gateway node(s) 918, and serving node(s) 916, is provided and dictated by radio technology(ies) utilized by mobile network platform 910 for telecommunication. Mobile network platform 910 can also include the MMEs, HSS/PCRFs, SGWs, and PGWs disclosed herein.

In addition to receiving and processing CS-switched traffic and signaling, PS gateway node(s) 918 can authorize and authenticate PS-based data sessions with served mobile devices. Data sessions can include traffic, or content(s), exchanged with networks external to the wireless network platform 910, like wide area network(s) (WANs) 950, enterprise network(s) 970, and service network(s) 980, which can be embodied in local area network(s) (LANs), can also be interfaced with mobile network platform 910 through PS gateway node(s) 918. It is to be noted that WANs 950 and enterprise network(s) 970 can embody, at least in part, a service network(s) like IP multimedia subsystem (IMS). Based on radio technology layer(s) available in technology resource(s) 917, packet-switched gateway node(s) 918 can generate packet data protocol contexts when a data session is established; other data structures that facilitate routing of packetized data also can be generated. To that end, in an aspect, PS gateway node(s) 918 can include a tunnel interface (e.g., tunnel termination gateway (TTG) in 3GPP UMTS network(s) (not shown)) which can facilitate packetized communication with disparate wireless network(s), such as Wi-Fi networks.

In embodiment 900, wireless network platform 910 also includes serving node(s) 916 that, based upon available radio technology layer(s) within technology resource(s) 917, convey the various packetized flows of data streams received through PS gateway node(s) 918. It is to be noted that for technology resource(s) 917 that rely primarily on CS communication, server node(s) can deliver traffic without reliance on PS gateway node(s) 918; for example, server node(s) can embody at least in part a mobile switching center. As an example, in a 3GPP UMTS network, serving node(s) 916 can be embodied in serving GPRS support node(s) (SGSN).

For radio technologies that exploit packetized communication, server(s) 914 in wireless network platform 910 can execute numerous applications that can generate multiple disparate packetized data streams or flows, and manage (e.g., schedule, queue, format . . . ) such flows. Such application(s) can include add-on features to standard services (for example, provisioning, billing, customer support . . . ) provided by wireless network platform 910. Data streams (e.g., content(s) that are part of a voice call or data session) can be conveyed to PS gateway node(s) 918 for authorization/authentication and initiation of a data session, and to serving node(s) 916 for communication thereafter. In addition to application server, server(s) 914 can include utility server(s), a utility server can include a provisioning server, an operations and maintenance server, a security server that can implement at least in part a certificate authority and firewalls as well as other security mechanisms, and the like. In an aspect, security server(s) secure communication served through wireless network platform 910 to ensure network's operation and data integrity in addition to authorization and authentication procedures that CS gateway node(s) 912 and PS gateway node(s) 918 can enact. Moreover, provisioning server(s) can provision services from external network(s) like networks operated by a disparate service provider; for instance, WAN 950 or Global Positioning System (GPS) network(s) (not shown). Provisioning server(s) can also provision coverage through networks associated to wireless network platform 910 (e.g., deployed and operated by the same service provider), such as femto-cell network(s) (not shown) that enhance wireless service coverage within indoor confined spaces and offload RAN resources in order to enhance subscriber service experience within a home or business environment by way of UE 975.

It is to be noted that server(s) 914 can include one or more processors configured to confer at least in part the functionality of macro network platform 910. To that end, the one or more processor can execute code instructions stored in memory 930, for example. It is should be appreciated that server(s) 914 can include a content manager 915, which operates in substantially the same manner as described hereinbefore.

In example embodiment 900, memory 930 can store information related to operation of wireless network platform 910. Other operational information can include provisioning information of mobile devices served through wireless platform network 910, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 930 can also store information from at least one of telephony network(s) 940, WAN 950, enterprise network(s) 970, or SS7 network 960. In an aspect, memory 930 can be, for example, accessed as part of a data store component or as a remotely connected memory store.

Figure 10:
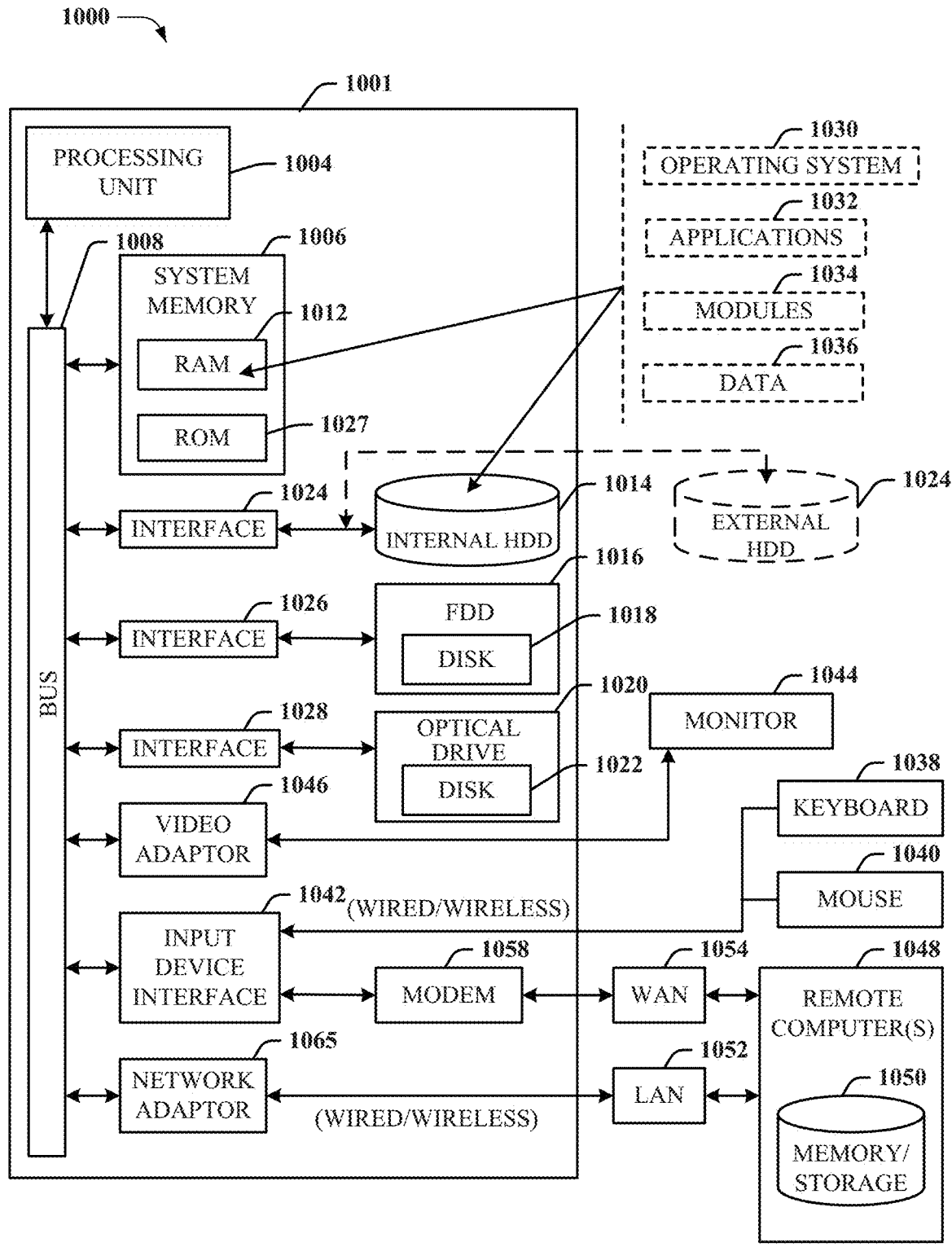
FIG. 10 illustrates an example block diagram of a computer that can be operable to execute processes and methods in accordance with various aspects and embodiments of the subject disclosure.

Referring now to FIG. 10, there is illustrated a block diagram of a computer 1000 operable to execute the functions and operations performed in the described example embodiments. For example, a network node (e.g., network node 106, CU 302, DU 308, 310, or 312 e.g.,) or UE 102, 104, or 314, etc., may contain components as described in FIG. 10. The computer 1000 can provide networking and communication capabilities between a wired or wireless communication network and a server and/or communication device. In order to provide additional context for various aspects thereof, FIG. 10 and the following discussion are intended to provide a brief, general description of a suitable computing environment in which the various aspects of the embodiments can be implemented to facilitate the establishment of a transaction between an entity and a third party. While the description above is in the general context of computer-executable instructions that can run on one or more computers, those skilled in the art will recognize that the various embodiments also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the various methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the various embodiments can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Referring now to FIG. 10, there is illustrated a block diagram of a computer 1000 operable to execute the functions and operations performed in the described example embodiments. For example, a network node (e.g., network node 106, CU 302, e.g.,) may contain components as described in FIG. 10. The computer 1000 can provide networking and communication capabilities between a wired or wireless communication network and a server and/or communication device. In order to provide additional context for various aspects thereof, FIG. 10 and the following discussion are intended to provide a brief, general description of a suitable computing environment in which the various aspects of the embodiments can be implemented to facilitate the establishment of a transaction between an entity and a third party. While the description above is in the general context of computer-executable instructions that can run on one or more computers, those skilled in the art will recognize that the various embodiments also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the various methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the various embodiments can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 10, implementing various aspects described herein with regards to the end-user device can include a computer 1000, the computer 1000 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1027 and random access memory (RAM) 1012. A basic input/output system (BIOS) is stored in a non-volatile memory 1027 such as ROM, EPROM, EEPROM, which BIOS contains the basic routines that help to transfer information between elements within the computer 1000, such as during start-up. The RAM 1012 can also include a high-speed RAM such as static RAM for caching data.

The computer 1000 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1394 interface technologies. Other external drive connection technologies are within contemplation of the subject embodiments.

The drives and their associated computer-readable media provide nonvolatile storage of data, data structures, computer-executable instructions, and so forth. For the computer 1000 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1000, such as zip drives, magnetic cassettes, flash memory cards, cartridges, and the like, can also be used in the example operating environment, and further, that any such media can contain computer-executable instructions for performing the methods of the disclosed embodiments.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the various embodiments can be implemented with various commercially available operating systems or combinations of operating systems.

A user can enter commands and information into the computer 1000 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 1394 serial port, a game port, a USB port, an IR interface, etc.

A monitor 1044 or other type of display device is also connected to the system bus 1008 through an interface, such as a video adapter 1046. In addition to the monitor 1044, a computer 1000 typically includes other peripheral output devices (not shown), such as speakers, printers, etc.

The computer 1000 can operate in a networked environment using logical connections by wired and/or wireless communications to one or more remote computers, such as a remote computer(s) 1048. The remote computer(s) 1048 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1000 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1000 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 through the input device interface 1042. In a networked environment, program modules depicted relative to the computer, or portions thereof, can be stored in the remote memory/storage device 1050. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk;

magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects of the embodiments. In this regard, it will also be recognized that the embodiments comprise a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data.

Computer-readable storage media can include, but are not limited to, random access memory (RAM), read only memory (ROM), electrically erasable programmable read only memory (EEPROM), flash memory or other memory technology, solid state drive (SSD) or other solid-state storage technology, compact disk read only memory (CD ROM), digital versatile disk (DVD), Blu-ray disc or other optical disk storage, magnetic cassettes, magnetic tape, magnetic disk storage or other magnetic storage devices or other tangible and/or non-transitory media which can be used to store desired information.

In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations.

Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the claims below.

What is claimed is:

1. A transceiver device, comprising:
a processor; and
a memory that stores executable instructions that, when executed by the processor, facilitate performance of operations, comprising:
receiving a packet at a protocol stack of a radio access network;
in response to determining that the packet is associated with a predefined radio access bearer, encoding the packet with a rateless fountain code, resulting in a group of encoded packets, wherein respective encoded packets of the group of encoded packets comprise a first quantity of source bits of the packet and a second quantity of repair bits, and wherein the first quantity is equal to the second quantity; and
transmitting the group of encoded packets to a receiver device via a group of relay devices.

2. The transceiver device of claim 1, wherein the operations further comprise:
transmitting each encoded packet of the group of encoded packets to respective relay devices of the group of relay devices.

3. The transceiver device of claim 1, wherein the encoding of the packet with the rateless fountain code facilitates reconstructing the packet from the group of encoded packets in response to an encoded packet of the group of encoded packets being determined to be missing.

4. The transceiver device of claim 1, wherein the predefined radio access bearer is a radio access bearer that satisfies a criterion with regard to a latency and a reliability of the radio access bearer.

5. The transceiver device of claim 1, wherein the operations further comprise:
encoding the packet using the rateless fountain code at a packet data convergence protocol layer of the protocol stack of the radio access network.

6. The transceiver device of claim 1, wherein the operations further comprise:
encoding the packet using the rateless fountain code before a packet data convergence protocol layer of the protocol stack.

7. The transceiver device of claim 1, wherein the transceiver device is a base station device and the receiver device is a user equipment device.

8. The transceiver device of claim 1, wherein the transceiver device is a user equipment device and the receiver device is a base station device.

9. The transceiver device of claim 1, wherein the operations further comprise:
attaching identical headers to each encoded packet of the group of encoded packets.

10. The transceiver device of claim 1, wherein the encoding of the packet with the rateless fountain code further comprises:
splitting the packet into a number of encoded packets, wherein the number of encoded packets is based on a number of relay devices of the group of relay devices.

11. A method, comprising:
determining, by a radio access network device comprising a processor, that a packet is associated with a radio access bearer satisfying a defined criterion relating to a latency and a reliability of the radio access bearer, wherein the radio access network device is part of a radio access network;

encoding, by the radio access network device, the packet with a rateless fountain code resulting in a group of encoded packets, wherein respective encoded packets of the group of encoded packets comprise a first quantity of source bits of the packet and a second quantity of repair bits, and wherein the first quantity is equal to the second quantity; and transmitting, by the radio access network device, the group of encoded packets to a user equipment device via a split bearer associated with a group of network paths of the radio access network.

12. The method of claim 11, wherein the transmitting comprises:

transmitting the respective encoded packets of the group of encoded packets to respective relay devices.

13. The method of claim 11, wherein the radio access bearer conforms to an ultra-reliable low latency communication protocol.

14. The method of claim 11, wherein the encoding comprises:

encoding the packet at a packet data convergence protocol layer of a protocol stack of the radio access network.

15. The method of claim 11, further comprising:

attaching, by the radio access network device, identical headers to each encoded packet of the group of encoded packets.

16. A receiver device, comprising:
a processor; and
a memory that stores executable instructions that, when executed by the processor, facilitate performance of operations, comprising:
receiving, from respective relay devices, encoded packets associated with a split bearer, wherein the encoded packets respectively comprise a first quantity of source bits of a packet and a second quantity of repair bits, and wherein the first quantity is equal to the second quantity;
verifying an integrity of the encoded packets;
determining that the encoded packets are associated with a radio access bearer satisfying a defined criterion relating to latency and reliability; and
decoding the encoded packets using a rateless fountain code, resulting in a decoded packet.

17. The receiver device of claim 16, wherein a first number of bits associated with the encoded packets is at least as large as a second number of bits associated with the decoded packet.

18. The receiver device of claim 17, wherein the verifying of the integrity comprises determining that an encoded packet of the encoded packets is corrupted.

19. The receiver device of claim 16, wherein the decoding is performed at a packet data convergence protocol layer of a radio access network protocol stack.

20. The receiver device of claim 17, wherein the encoded packets have identical headers.

* * * * *